United States Patent [19]
DeLaCruz et al.

[11] Patent Number: 6,051,871
[45] Date of Patent: Apr. 18, 2000

[54] HETEROJUNCTION BIPOLAR TRANSISTOR HAVING IMPROVED HEAT DISSIPATION

[75] Inventors: Javier Andres DeLaCruz; Xiangdong Zhang, both of Nashua, N.H.; Matthew F. O'Keefe, Chelmsford, Mass.; Gregory Newell Henderson, Sudburg, Mass.; Yong-Hoon Yun, Acton, Mass.

[73] Assignee: The Whitaker Corporation, Wilmington, Del.

[21] Appl. No.: 09/166,673

[22] Filed: Oct. 5, 1998

Related U.S. Application Data

[60] Provisional application No. 60/091,199, Jun. 30, 1998.

[51] Int. Cl.[7] .................. H01L 27/082; H01L 27/102; H01L 29/70
[52] U.S. Cl. .................. 257/571; 257/573; 257/586; 257/618; 257/623; 257/625; 257/626; 257/707; 257/723; 257/724; 257/725
[58] Field of Search .................. 257/571, 573, 257/586, 623, 618, 626, 707, 625, 723, 724, 725

[56] References Cited

U.S. PATENT DOCUMENTS 5,672,904  9/1997  Miyata et al. ............... 257/472
5,719,433  2/1998  Delage et al. ............... 257/625
5,834,800  11/1998  Jalali-Farahani et al. ....... 257/198

OTHER PUBLICATIONS

1995 IEEE MTT–S Digest; WE2A–5: A Scalable MMIC–Compatible Power HBT. G. Jackson, D. Teeter, D. Bradford, and M. Cobb, pp. 457–460.

*Primary Examiner*—Mahshid Saadat
*Assistant Examiner*—Matthew E. Warren

[57] ABSTRACT

A heterojunction bipolar transistor has a mesa including collector 604, base 603, and emitter 602 layers. The mesa has first and second sidewalls 606. An improved heat dissipation structure comprises a layer of electrically insulative and thermally conductive material 607 disposed on one of the sidewalls. A thermal path metal 600 is electrically connected to the emitter 602 and is disposed on the layer of electrically insulative and thermally conductive material 607. The thermal path metal 600 extends from the emitter 602 to the substrate 608 providing for efficient dissipation of heat that is generated by the HBT device.

12 Claims, 4 Drawing Sheets

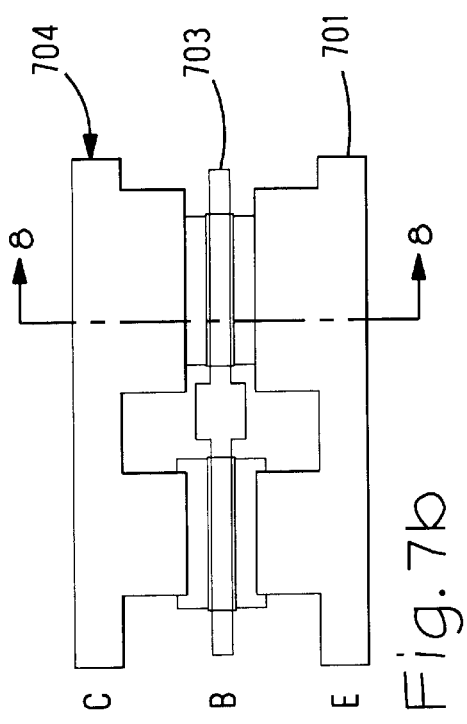
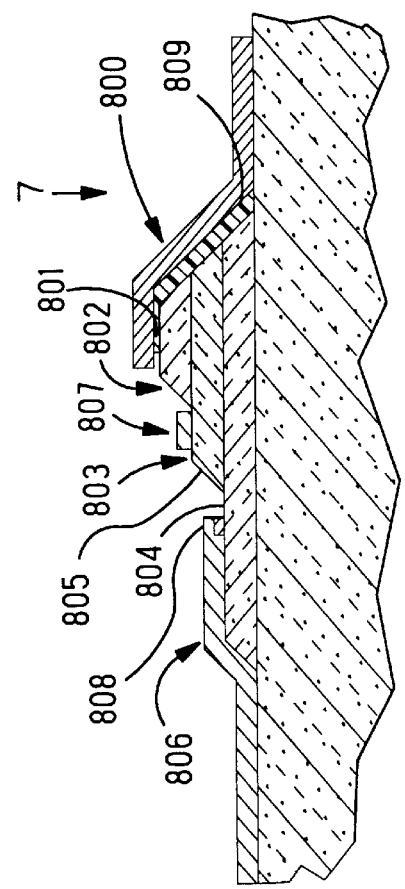
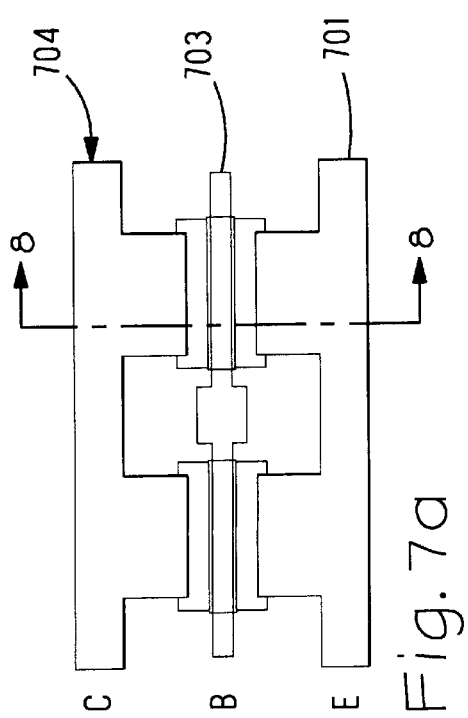
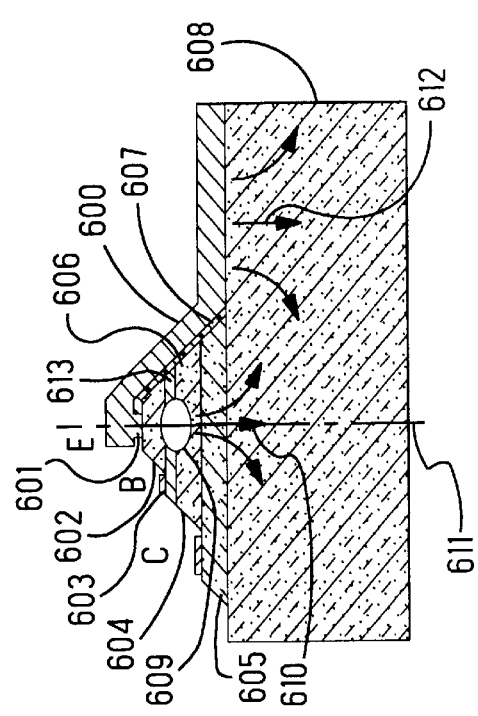

HETEROJUNCTION BIPOLAR TRANSISTOR HAVING IMPROVED HEAT DISSIPATION

This application claims the benefit of U.S. Provisional No. 60/091,199 filed Jun. 30, 1998.

FIELD OF THE INVENTION

The present invention relates to a heterojunction bipolar transistor (HBT) with an improved thermal dissipation capability.

BACKGROUND OF THE INVENTION

The present invention relates to a technique and structure therefore, for improving the power output and stability of heterojunction bipolar transistors. One of the advantages of HBTs based on III–V materials (gallium arsenide (GaAs) and indium phosphide (InP)) is their high power density capability, which is critical in low cost and high power amplifiers for commercial and military applications. However, the inefficient heat dissipation in such devices has been the major constraint to the power density advantage. The inefficient heat dissipation is due to the fact that the thermal conductivity of GaAs is approximately one third (⅓) that of silicon. The heat in a GaAs HBT is generated in a region under the emitter mesa, and then spreads out normally through the semi-insulating GaAs substrate as shown by the arrows 100 in FIG. 1. This generation of heat is commonly referred to as self-heating, a term of art, and is due to the flow of current across the emitter/base and base/collector junctions which is of course due to voltage drops across the junctions. The flow of current across the junctions dissipates power in the form of heat. Elevated junction temperature due to the device self-heating not only degrades power and gain performance, but also the device lifetime. Therefore, it is of utmost importance to find an efficient method of removing joule heat from the device.

There are two conventional techniques to improve the dissipation of joule heat in HBTs. The first technique is a flip-chip assembly approach (FIG. 2). The second technique is commonly referred to as a thermal shunt as it uses thick-plated air bridges for spreading the heat (FIG. 3).

The flip-chip assembly approach is a technique to extract the joule heat generated within the device from above through metal contacts and to place these contacts on a large heat sink. This is most readily achieved by turning the device upside-down onto the heat sink. Accordingly, this process is well known in the art as flip-chip mounting. Flip-chip mounting of a HBT requires contacts to the heat sink to be placed directly over the emitter fingers. In conventional flip-chip mounting in GaAs or other III–V devices, the contacts provide the path to thermal ground and electrical ground. This configuration, however, does not allow for the placement of an off-finger ballast resistor between the emitter fingers and the ground. Ballast resistors are required for stable high power operation. To this end, the flip-chip mounting approach, while being quite efficient in improving thermal performance characteristics, is a challenging assembly process. The small physical feature sizes of the emitter mesa (typically on the order of 1–3 microns) make manufacturability of the flip-chip process difficult in terms of alignment of the device contacts to the heat-sink contacts, since neither contact is visible during the process. Accordingly, flip-chip mounting has clear disadvantages as a technique to remove heat in a device. For power HBT structures with multiple fingers, the requirement of a ballast resistor at each emitter finger further exacerbates the problem.

The use of a thermal shunt (shown in FIG. 3) as a technique to dissipate joule heat in a HBT structure has also proved problematic. The manufacturability of the shunt metal and the size of the metal post connecting the emitter mesa to the shunt metal limit the amount of improvement in the HBT thermal characteristics. Clearly, the thicker the shunt and the larger the post, the lower the thermal impedance, but the more difficult reproducible results are to achieve in large scale processing. Further details of both of the above-captioned prior techniques for dissipating heat in HBT structures can be found in "Very High Power Density CW Operation Of GaAs/AlGaAs Microwave HBTs", IEEE Electronic Device Letters, Vol., 14, No. 10, October 1993, pgs. 493–495; and "Bump Heat Sink Technology, A Novel Assembly Technology Suitable For Power HBTs", GaAs IC Symposium, pgs. 337–340, the disclosures of which are specifically incorporated herein by reference.

Finally, a conventional HBT structure has a symmetric layout that permits uniform power dissipation through the emitter mesa, the base and the collector, as shown in FIG. 2. This symmetry is relatively standard as can been seen in FIGS. 2, and 3 as well, where a line of symmetry 101, 201, 301 can be drawn through the emitter mesa and a mirror image is found on either side of the emitter mesa. In this configuration, the heat is concentrated in a region under the emitter mesa. The narrow strip of metal overlay (shown in FIG. 4 at 400) does not suffice as a good thermal path in this design. The thermal dissipation characteristics of the device cannot be improved by enlarging the emitter metallization or the metal overlay thereof, because the design is symmetrical. Therefore, a structure is needed which will improve the dissipation of heat from the device.

Accordingly, what is needed is a technique for improving the thermal dissipation capabilities in HBT structures for power applications which overcomes the difficulties in processing and reproducibility of the prior art techniques.

SUMMARY OF THE INVENTION

The present invention is drawn to a novel technique for dissipating joule heat from the heterojunction bipolar transistor (HBT) structure.

HBT structure according to the teachings of the present invention includes a substrate having a mesa structure. The mesa has a subcollector layer, a collector layer, a base layer and an emitter layer. At least one of the collector, base, and emitter layers has a terminal contact and the mesa has a first side and a second side. The second side of the mesa has a sidewall on which is disposed a layer of electrically insulative and thermally conductive material. A thermal path metal is further disposed on the layer of electrically insulative and thermally conductive material, the thermal path metal extending from one of the terminal contacts to the substrate and making thermal contact to both the terminal contact and the substrate.

There are two major paths for dissipation of joule heat within the HBT. The first is directly into the semi-insulating GaAs substrate through the base and collector layers. The second, and more efficient path, is provided by the metal overlay or metal path 500, 600 that lies down the side of the asymmetric mesa structure. This feature has been termed the thermal-path metal. The large metal area allows for rapid heat spreading in the HBT and thereby the dissipation of joule heat. Due to the asymmetric nature of the structure of the present invention, there is no requirement for interconnects to cross one another in multi-cell applications. The structure of the preferred embodiment of the invention of the present disclosure has the thermal-path metal along one side of the mesa structure and is electrically and thermally connected to the emitter contact. Along the side wall 606 of the mesa structure, where the thermal-path metal traverses the base and collector regions, a layer of dielectric, preferably $Si_3N_4$, is disposed between the thermal-path metal and the layers of the collector and base regions. The dielectric material is an electrical insulator but is thermally conductive, thereby allowing the thermal impedance to be as low as possible, enabling the desired performance characteristics in power applications.

BRIEF DESCRIPTION OF THE DRAWINGS

FIG. 6 is a cross-sectional view of the asymmetric HBT structure having the thermal path of the invention of the present disclosure.

FIG. 7a is a top view of the interconnect layout for two HBT structures of the invention of the present disclosure.

FIG. 7b is an alternative embodiment of the metal overlay with the metal overlay extending over 3 sides of the mesa.

FIG. 8 is a cross-sectional view along line 8—8 in FIG. 7a, b.

DETAILED DESCRIPTION OF THE INVENTION

Figure 1:
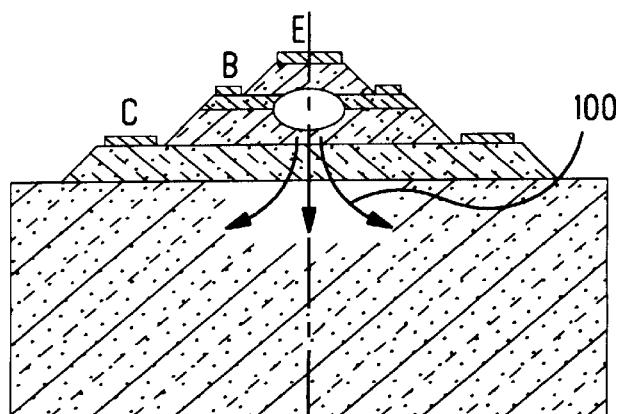
FIG. 1 is a cross-sectional view of a conventional GaAs HBT structure on a semi-insulating GaAs substrate.
Figure 2:
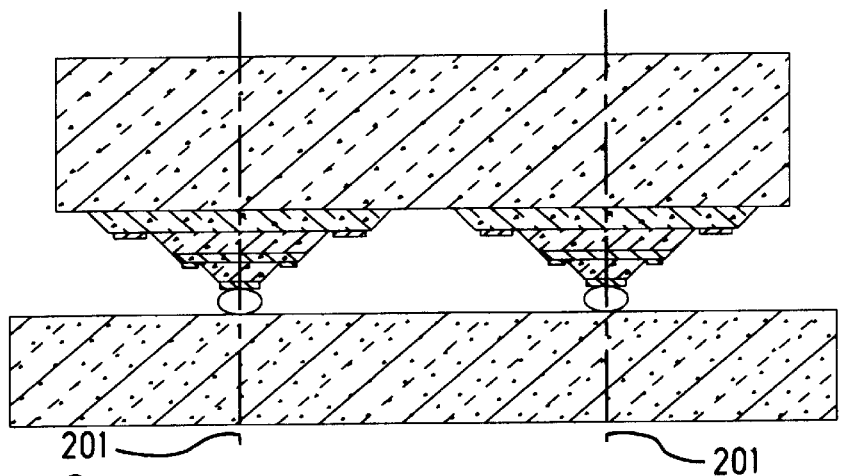
FIG. 2 is a cross-sectional view of two devices shown in FIG. 1 mounted in a flip-chip manner with bumps connecting the emitter contact to a metal heat sink.
Figure 3:
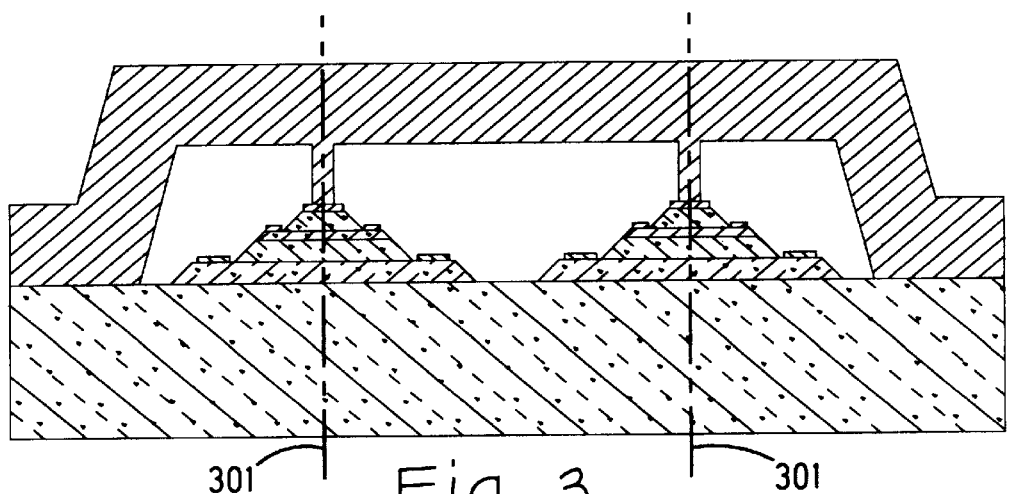
FIG. 3 is a cross-sectional view of a HBT structure shown in FIG. 1 mounted in a thermal shunt configuration.
Figure 4:
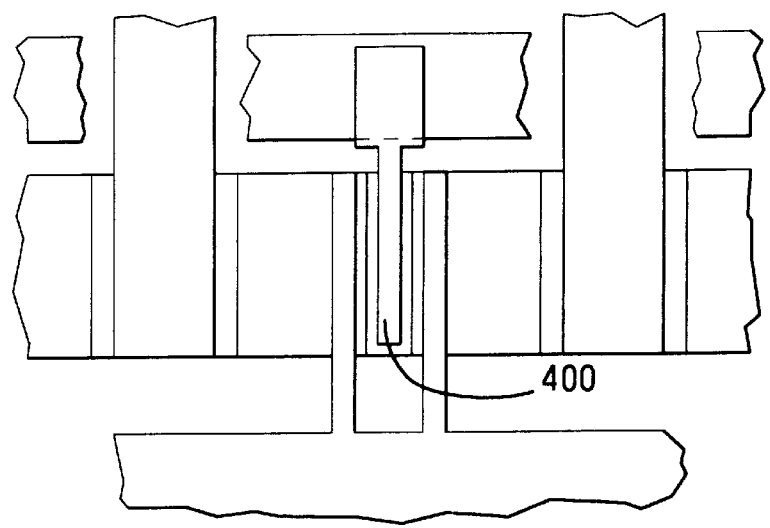
FIG. 4 is a top view of a conventional HBT structure showing the interconnect layout.
Figure 5A:
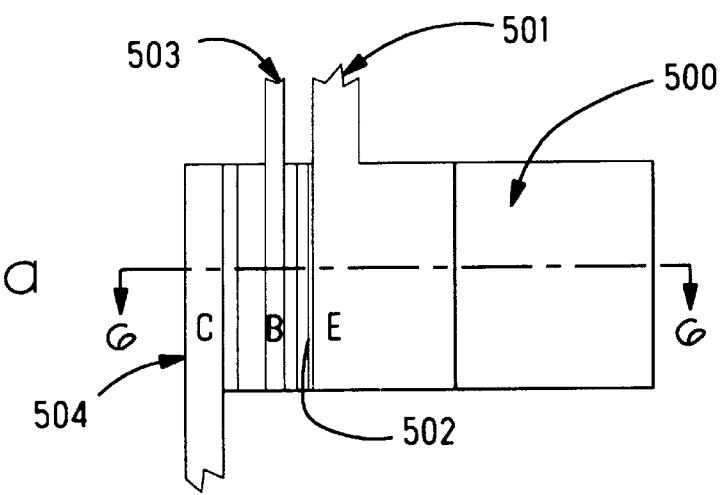
FIG. 5a is a top view of the wide emitter HBT structure of the invention of the present disclosure.
Figure 5B:
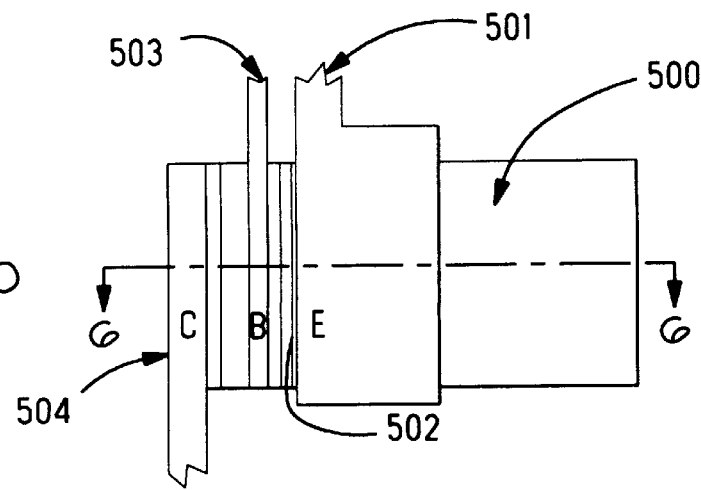
FIG. 5b is an alternative embodiment of the metal overlay with the metal overlay extending over 3 sides of the mesa.

The metallization pattern for one of the transistors of the invention of the present disclosure is shown in top view in FIGS. 5a and 5b. To this end, the collector metallization 504, the base metallization 503 and the emitter metallization 501 are shown. The emitter is shown partially at 502. The structure of the embodiments invention of the present disclosure, shown in top view of FIGS. 5a and 5b, clearly shows the relatively large size of the metal overlay 500, the emitter base and collector metallizations 501, 503 and 504, respectively. By virtue of this relatively large thermal path metal or metal overlay a low thermal resistance path is provided. The attendant advantages of such a structure of the present disclosure become readily apparent to one of ordinary skill in the art having had the benefit of the present disclosure. FIG. 6 shows a cross-sectional view of the structure shown in FIGS. 5a and 5b. FIG. 5b is an alternative embodiment of the invention of the present disclosure. In this embodiment the metal overlay is extended or widened as shown when compared to the metal overlay shown in FIG. 5a. This embodiment shows the metal overlay extending over three sides of the mesa (as opposed to one side as shown in FIG. 5a) and thus improves the heating dissipation capability of the metal overlay 500 by increasing the surface area of the overlay, again when compared to the overlay structure shown in FIG. 5a. The device of the present disclosure, a heterojunction bipolar transistor, is fabricated on a GaAs substrate which is semi-insulating and is shown at 608 in FIG. 6. The asymmetric HBT has a first layer 605, which is the collector contact layer (or sub-collector layer). A second layer, the collector layer is shown at 604; a third layer, the base layer, is shown at 603; and the emitter layer is shown at 602. The thermal-path metal is shown generally at 600, and a layer of suitable dielectric 607 is disposed between the sidewalls 606 of the asymmetric mesa 613 and the thermal-path metal 600. This material is preferably silicon nitride ($Si_3N_4$), although other materials can be used. A suitable material is one which exhibits low electrical conductivity, while exhibiting a high thermal conductivity. The metal/dielectric/semiconductor structure made up of the thermal-path metal 600, the dielectric 607, and the sidewalls 606 of the asymmetric mesa 613, would normally be of concern as a source of increased parasitic capacitance. However, increases in $C_{eb}$ and $C_{ec}$, the emitter/base and emitter/collector capacitances, respectively, are minimized by effectively eliminating steps in the sidewall, 606. The resulting asymmetric structure has a smaller base mesa compared to the conventional symmetrical structure which has a large base mesa as can be appreciated from a review of the structure shown in FIG. 1. Consequently, $C_{bc}$, the base/collector capacitance is reduced in the device of the present invention compared to the conventional symmetrical structure.

Figure 9A:
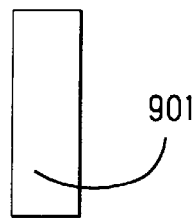
FIGS. 9a–9h are top and cross-sectional views of the fabrication sequence used to effect the mesa structure of the present invention.
Figure 9B:
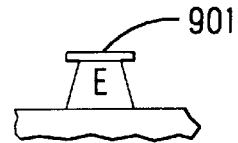
Figure 9C:
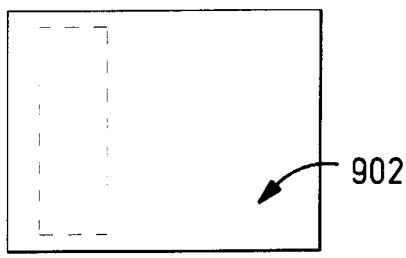
Figure 9D:
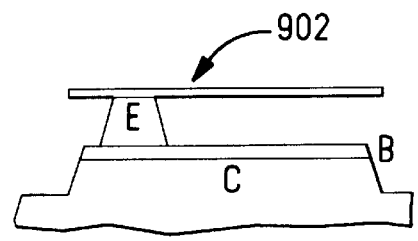
Figure 9E:
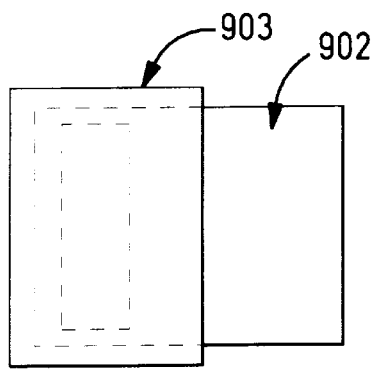
Figure 9F:
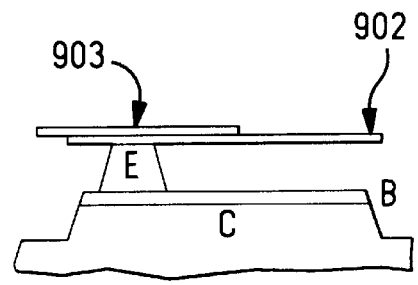
Figure 9G:
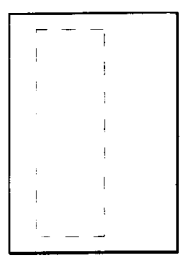
Figure 9H:
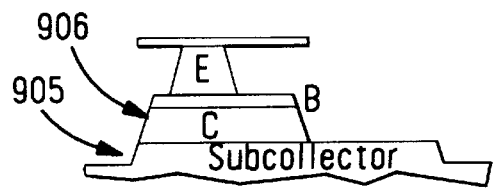

The structure shown in FIG. 6 is fabricated as follows. Conventional HBT mesa structures are fabricated by etching each individual layer separately. A HBT structure consists of an emitter layer or layers, on top of a base layer or layers, on top of a collector layer or layers, on top of a semi-insulating substrate. The formation of the mesa in conventional HBT structures defines each layer with a photolithographical step and etches each layer sequentially. As each layer is etched the area defined by the subsequent etch is greater than that of the previous step. To allow for alignment tolerances in the photolithographical process, well known to those skilled in the art, subsequently etched areas extend beyond previously defined mesas. Consequently, conventional HBT mesa structures define emitter mesa first, then later, define the base, then the collector and finish with an etch that isolates the device from its neighbor. The HBT structure of the invention of the present disclosure defines the emitter area, then defines the geometry of the isolating or subcollector mesa. However, the etch is only partially completed before the base mesa is defined by re-exposing the subcollector (isolation) photolithographical material. By maintaining the certain portions of the original isolation geometry a single sidewall is generated during the subsequent definition of the base and isolation mesa. Turning to FIGS. 9a–9h a more detailed description of the processing to fabricate the asymmetric mesa is shown in both top and side views. FIGS. 9a, 9b show a top view and cross-sectional view, respectively, of the definition of the emitter mesa with the photoresist 901 as shown. The next step FIGS. 9c, 9d (again in top and cross section) show the step in which the subcollector layer geometry is defined and partially etched. In this step, the photoresist defined by a geometry shown at 902, as is well known to one of ordinary skill in the art. Next, as is shown in FIGS. 9e, 9f (in top and cross-sectional views), the base geometry is defined through the exposure of the photoresist as shown at 903. Finally, as is shown in FIGS. 9g, 9f (in top and cross-section), the asymmetric mesa structure is realized with the resulting base geometry and base and collector etching steps shown. By virtue of the anisotropic nature of the etch, the subcollector mesa shown at 905 is maintained. The sidewall of the asymmetric mesa of the HBT is shown at 906 and is a direct benefit of the above described processing steps. The procedure to fabricate the invention of the present disclosure outlined above differs significantly from the prior art as the isolating mesa is defined prior to the formation of the mesa that defines the base.

There are two major paths for dissipation of joule heat in the present invention. In the structure shown in FIG. 6 the heat is generated in a region directly under the emitter mesa. The first path is through the thermal-path metal 600, which is connected to the emitter mesa by the emitter contact 601, and into the semi-insulating substrate, shown at 612. The second path is directly from the self-heating area 609 through to the GaAs substrate shown generally as 610. This latter path is less preferable since the thermal impedance of the semiconductor layers is greater than that of the thermal-path metal. By virtue of the asymmetry about the line shown generally as 611, the ability to dissipate joule heat is increased when compared to the prior techniques for dissipating joule heat in the symmetric mesa HBT structure. It is of interest to note that line 611 bisects the mesa into two parts, however that these two parts are unequal by virtue of the assymetry of the mesa. That is the term bisect in this disclosure means to cut into two parts which are unequal. The HBT structure of the invention of the present disclosure enables the dissipation of joule heat through the low impedance thermal-path metal, which is in parallel with the high impedance path through the semiconductor layers. This differs from the structures shown in FIG. 1, which fosters the dissipation of heat only through the semiconductor layers. The structure of the invention of the present disclosure also enables dissipation of joule heat through the dielectric layer 607 to the relatively large area metallization 600. This is in clear contrast to prior art structures, which are symmetric about the emitter mesa and enable dissipation of heat only through the top or bottom. The performance of the device is improved significantly over symmetric structures of the prior art because the invention of the present disclosure enables joule heat to be dissipated in a much more efficient manner. Thermal resistance measurements show that for a 40-micron finger length the asymmetric design reduces the thermal resistance by on the order of 30% compared to conventional HBT structures.

A top view of a two-transistor cell in particular highlighting the metal interconnects is shown in FIGS. 7a and 7b. The metal overlay or thermal path metal 701 is connected to the emitter layer via the emitter contact (not shown) or emitter metallization. Between the metal overlay 701 and the sidewalls of the emitter, base, and collector layers, the thin dielectric layer exists for the dissipation of heat as described hereinabove. The base interconnect is shown at 703 and the collector interconnect is shown at 704. FIG. 7b is an alternative embodiment of the invention of the present disclosure. In this embodiment the metal overlay is extended or widened as shown when compared to the metal overlay shown in FIG. 7a. This embodiment shows the metal overlay extending over three sides of the mesa (as opposed to one side as shown in FIG. 7a) and thus improves the heating dissipation capability of the metal overlay 701 by increasing the surface area of the overlay, again when compared to the overlay structure shown in FIG. 7a. The structure shown in FIG. 8 is a cross-sectional view along the line 8—8 of FIGS. 7a and 7b. The metal overlay or thermal path metal is shown at 800 connecting to the emitter layer by way of the emitter contact 801, with the layer of dielectric material shown at 809. The base layer is shown at 803 with the base contact shown at 807. The collector layer 805 and collector contact layer 804 with the collector interconnect and contact shown 806, 808, respectively. This structure shown in FIG. 6 is virtually identical to the structure shown in cross-section in FIG. 8, with the view in FIGS. 7a and 7b providing a two cell perspective of the invention of the present disclosure. As can be readily appreciated from a review of the present invention, the single device (cell) structure of FIG. 6 can be used in multi-cell applications by use of an interconnection scheme as shown for example, in FIGS. 7a and 7b.

Finally, it is of interest to note that heretofore the structure in which the region beneath the emitter mesa is the primary source of heat has been focused upon. In all actuality, the structure of the present disclosure can be modified significantly. To this end, the electrical role of sections labeled emitter, base and collector are interchangeable. In other words, the contact to the thermal-path metal, shown in FIG. 6 as 601, could be connected to the base or collector. In the embodiment in which the thermal-path metal contacts the base or collector, it is only necessary to modify the processing and fabrication of the device, in the alternative structures briefly described herein. Therefore, depending upon the desired application, the layout described here and above may vary to effect the dissipation of joule heat from the emitter, the base or the collector.

The invention having been described in detail, it is clear that variations and modifications to the basic invention described herein are within the purview of one of ordinary skill in the art. The basic invention is asymmetric mesa structure with a thermal-path metal having a sufficiently large area to effectively dissipate joule heat from the heat-generating region of the structure, the emitter, base or collector, in a manner which is thermally optimal to improve device performance and lifetime. To the extent that such modifications and variations of the disclosure of the present invention are within the purview of one of ordinary skill in the art having had the benefit of the present disclosure, such are deemed within the scope of the invention.

We claim:

1. A heterojunction bipolar transistor, comprising:
a substrate having a mesa structure thereon, said mesa having a subcollector layer, a collector layer, a base layer and an emitter layer; at least one of said collector, base, and emitter layers having a terminal contact, said mesa having a first side and a second side of said mesa, said second side having a sidewall, said sidewall having a layer of electrically insulative and thermally conductive material disposed thereon; and a thermal path metal disposed on said layer of electrically insulative and thermally conductive material, said thermal path metal extending from one of said terminal contacts to the substrate and making thermal contact to both said one of said terminal contacts and said substrate.

2. A heterojunction bipolar transistor as recited in claim 1, wherein said layer of electrically insulative and thermally conductive material is $Si_3N_4$.

3. A heterojunction bipolar transistor as recited in claim 1, wherein said subcollector layer is disposed on said substrate, said collector layer is disposed on said subcollector layer, said base layer is disposed on said collector layer and said emitter layer is disposed on said base layer.

4. A heterojunction bipolar transistor as recited in claim 3, wherein said emitter layer has an emitter metallization thereon, and said thermal metal path is electrically connected to said terminal contact on said emitter layer.

5. A heterojunction bipolar transistor as recited in claim 4, wherein said collector metallization and said base metallization are disposed on said first side of said mesa.

6. A heterojunction bipolar transistor as recited in claim 1, said sidewall having a uniform transition along its length.

7. A heterojunction bipolar transistor as recited in claim 1, wherein said subcollector layer, said collector layer, said base layer, and said emitter layer are asymmetric about an axis bisecting said mesa.

8. A heterojunction bipolar transistor, comprising: a substrate with a mesa structure thereon, said mesa having a subcollector layer, a collector layer, a base layer and an emitter layer; a first side of said mesa and a second side of said mesa, said second side having a sidewall, the sidewall having a uniform transition along its length; a layer of thermally conductive material disposed on said sidewall; and a thermal path metal disposed on said layer of thermally conductive material, said thermal path metal extending from a terminal contact on at least one of said collector, base and emitter layers to said substrate.

9. A heterojunction bipolar transistor as recited in claim 8, wherein said layer of electrically insulative and thermally conductive material is $Si_3N_4$.

10. A heterojunction bipolar transistor as recited in claim 8, wherein said subcollector layer is disposed on said substrate, said collector layer is disposed on said subcollector layer, said base layer is disposed on said collector layer and said emitter layer is disposed on said base layer.

11. A heterojunction bipolar transistor as recited in claim 10, wherein said emitter layer has an emitter metallization thereon, and said thermal metal path is electrically connected to said emitter.

12. A heterojunction bipolar transistor as recited in claim 8, wherein said subcollector layer, said collector layer, said base layer, and said emitter layer are asymmetric about an axis bisecting said mesa.

* * * * *